(12) United States Patent
Hoang et al.

(10) Patent No.: US 12,520,527 B2
(45) Date of Patent: Jan. 6, 2026

(54) SEMICONDUCTOR DEVICE AND SEMICONDUCTOR MEMORY DEVICE

(71) Applicant: KIOXIA CORPORATION, Tokyo (JP)

(72) Inventors: Ha Hoang, Kuwana Mie (JP); Kazuhiro Matsuo, Kuwana Mie (JP); Tomoki Ishimaru, Yokkaichi Mie (JP); Kenichiro Toratani, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 603 days.

(21) Appl. No.: 17/897,050

(22) Filed: Aug. 26, 2022

(65) Prior Publication Data

US 2023/0290882 A1 Sep. 14, 2023

(30) Foreign Application Priority Data

Mar. 18, 2022 (JP) .................. 2022-043358

(51) Int. Cl.
*H10D 30/67* (2025.01)
*H10B 12/00* (2023.01)

(52) U.S. Cl.
CPC ......... *H10D 30/6728* (2025.01); *H10B 12/33* (2023.02); *H10D 30/6756* (2025.01)

(58) Field of Classification Search
CPC .............. H01L 21/28114; H01L 21/44; H10D 30/6755; H10D 30/477; H10D 30/668; H10D 30/6735; H10D 30/6736; H10D 30/6739; H10D 30/6757; H10D 64/685; H10D 84/83; H10D 99/00; H10B 12/05; H10B 12/30; H10B 12/315; H10B 12/033; H10B 12/20; H10B 12/31; H10B 12/33; H10B 12/488

See application file for complete search history.

(56) References Cited

U.S. PATENT DOCUMENTS

| | | |
|---|---|---|
| 10,181,472 B1 | 1/2019 | Huang |
| 10,790,396 B2 | 9/2020 | Sawabe et al. |
| 11,502,128 B2 | 11/2022 | Wu |
| 2014/0170821 A1 | 6/2014 | Nyhus |

(Continued)

FOREIGN PATENT DOCUMENTS

| | | |
|---|---|---|
| JP | 2019169490 A | 10/2019 |
| JP | 2020155495 A | 9/2020 |

(Continued)

*Primary Examiner* — Edward Chin
(74) *Attorney, Agent, or Firm* — Kim & Stewart LLP

(57) ABSTRACT

According to one embodiment, a semiconductor device includes a first electrode, a second electrode, and an oxide semiconductor layer provided between the first electrode and the second electrode and including a first region, a second region between the first region and the second electrode, and a third region between the first region and the second region. A gate electrode surrounds the third region, and a gate insulating layer is between the gate electrode and the third region. A first resistivity of the first region is higher than a second resistivity of the second region. A first distance between the first electrode and the gate electrode in a first direction from the first electrode toward the second electrode is shorter than a second distance between the gate electrode and the second electrode in the first direction.

20 Claims, 11 Drawing Sheets

(56) References Cited

U.S. PATENT DOCUMENTS

| | | |
|---|---|---|
| 2019/0067437 A1 | 2/2019 | Ramaswamy et al. |
| 2019/0245096 A1* | 8/2019 | Ramaswamy ....... H10D 62/822 |
| 2019/0296155 A1* | 9/2019 | Sawabe .................. H10B 12/31 |
| 2019/0371911 A1* | 12/2019 | Miao .................... H10D 62/117 |
| 2020/0303554 A1 | 9/2020 | Sawabe et al. |
| 2021/0202485 A1 | 7/2021 | Inaba |
| 2021/0305431 A1* | 9/2021 | Ishimaru ............ H10D 30/6755 |
| 2022/0028894 A1* | 1/2022 | Yang .................... H10D 62/115 |
| 2022/0037363 A1 | 2/2022 | Jiang |
| 2022/0059535 A1 | 2/2022 | Sukekawa |

FOREIGN PATENT DOCUMENTS

| | | |
|---|---|---|
| JP | 2020532854 A | 11/2020 |
| TW | 201438111 A | 10/2014 |
| TW | 201917830 A | 5/2019 |
| TW | 202201742 A | 1/2022 |
| TW | 202205626 A | 2/2022 |

\* cited by examiner

SEMICONDUCTOR DEVICE AND SEMICONDUCTOR MEMORY DEVICE

CROSS-REFERENCE TO RELATED APPLICATION(S)

This application is based upon and claims the benefit of priority from Japanese Patent Application No. 2022-043358, filed Mar. 18, 2022, the entire contents of which are incorporated herein by reference.

FIELD

Embodiments described herein relate generally to a semiconductor device and a semiconductor memory device.

BACKGROUND

An oxide semiconductor transistor in which a channel is formed in an oxide semiconductor layer has excellent characteristics in that a channel leakage current during an OFF state is extremely small. Therefore, for example, the oxide semiconductor transistor can be used a switching transistor of a memory cell of a dynamic random access memory (DRAM).

DETAILED DESCRIPTION

Figure 1:
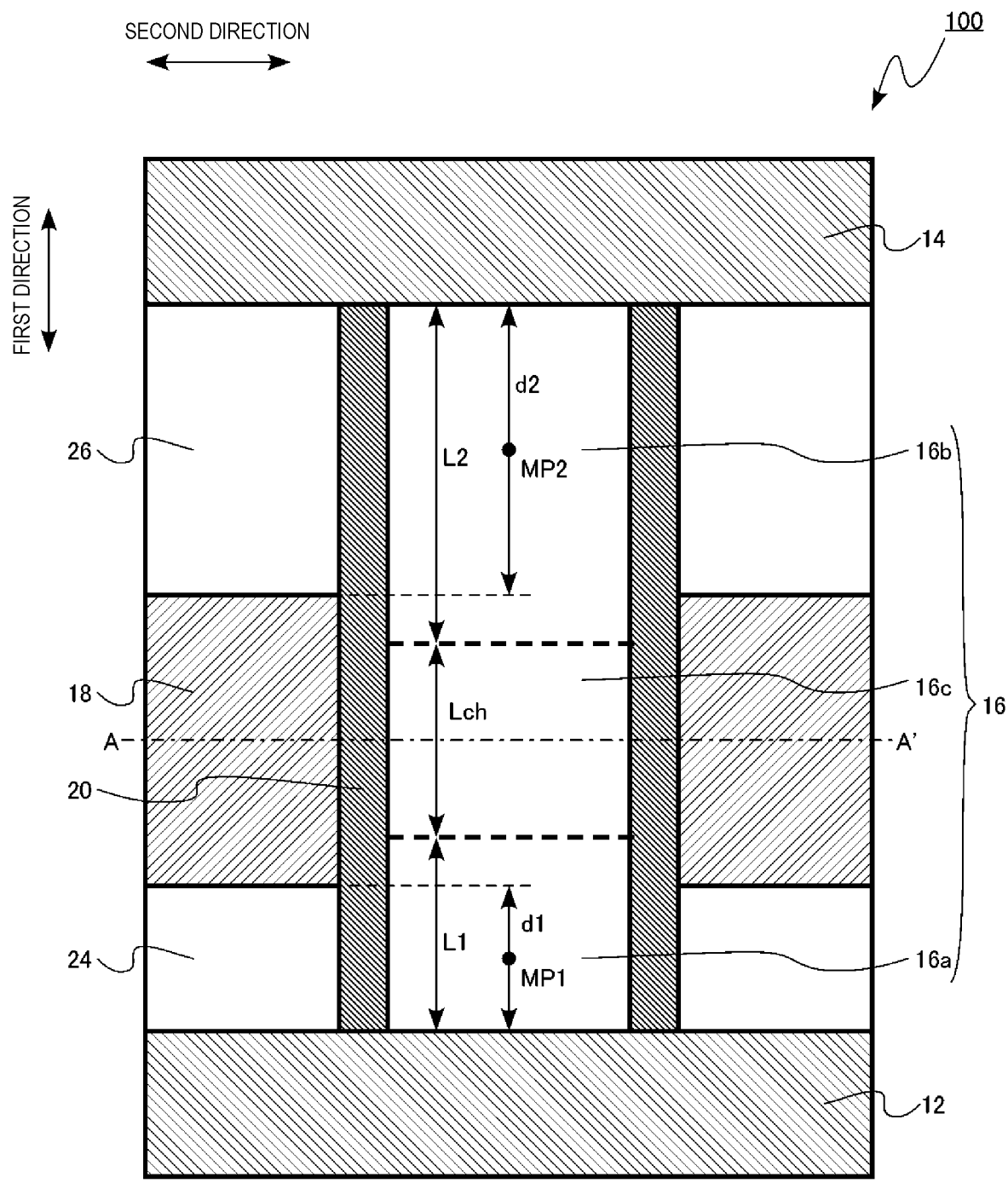
FIG. 1 is a schematic cross-sectional view of a semiconductor device according to a first embodiment.

Embodiments provide a semiconductor device having excellent transistor characteristics.

In general, according to one embodiment, a semiconductor device includes a first electrode, a second electrode, and an oxide semiconductor layer. The oxide semiconductor layer is between the first electrode and the second electrode and includes a first region, a second region between the first region and the second electrode, and a third region between the first region and the second region. A first resistivity of the first region is higher than a second resistivity of the second region. A gate electrode of the semiconductor device surrounds the third region, a gate insulating layer is between the gate electrode and the third region. A first distance from the first electrode to the gate electrode along a first direction from the first electrode toward the second electrode is shorter than a second distance from the gate electrode to the second electrode along the first direction.

Hereinafter, embodiments will be described with reference to the drawings. In the following description, the same or similar members or the like are denoted by the same reference numerals, and description of members or the like once described may be omitted as appropriate.

In the present description, terms "up" or "down" or the like may be used for the sake of convenience. However, such terms ("up" or "down") are used as indicating a relative positional relation in the drawings, and is not a term defining a positional relation with respect to gravity.

Qualitative analysis and quantitative analysis of chemical compositions of members constituting a semiconductor device and a semiconductor memory device in the present description may be executed by, for example, secondary ion mass spectrometry (SIMS), energy dispersive X-ray spectroscopy (EDX), or Rutherford back-scattering spectroscopy (RBS). For example, a transmission electron microscope (TEM) may be used for measurement of a thickness of each of the members constituting the semiconductor device and the semiconductor memory device, a distance between the members, a crystal grain size, and the like. A resistivity of the member constituting the semiconductor device and the semiconductor memory device may be measured by, for example, scanning spreading resistance microscopy (SSRM), or conductive atomic force microscopy (C-AFM).

First Embodiment

A semiconductor device according to a first embodiment includes: a first electrode; a second electrode; an oxide semiconductor layer provided between the first electrode and the second electrode and including a first region, a second region between the first region and the second electrode, and a third region between the first region and the second region; a gate electrode surrounding the third region; and a gate insulating layer provided between the gate electrode and the third region. A first resistivity of the first region is higher than a second resistivity of the second region. A first distance between the first electrode and the gate electrode in a first direction from the first electrode toward the second electrode is shorter than a second distance between the gate electrode and the second electrode in the first direction.

Figure 2:
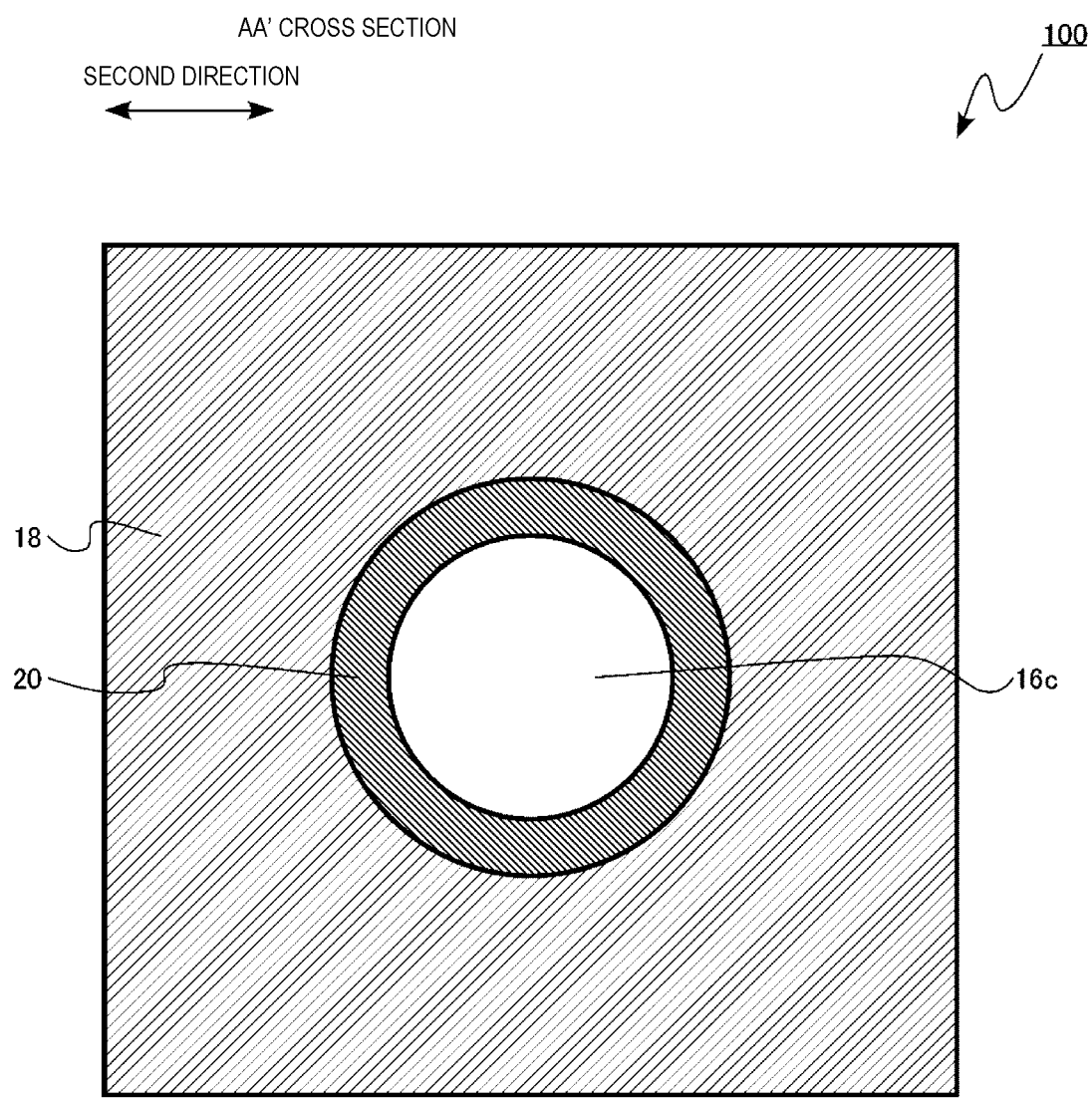
FIG. 2 is a schematic cross-sectional view of a semiconductor device according to a first embodiment.

FIGS. 1 and 2 are schematic cross-sectional views of the semiconductor device according to the first embodiment. FIG. 2 is a cross-sectional view taken along a line AA' in FIG. 1. In FIG. 1, an up-down direction is referred to as a first direction. In FIG. 1, a horizontal direction is referred to as a second direction. The second direction is perpendicular to the first direction.

The semiconductor device according to the first embodiment includes a transistor 100. The transistor 100 is an oxide semiconductor transistor in which a channel is formed in the oxide semiconductor layer. In the transistor 100, the gate electrode surrounds the portion of the oxide semiconductor layer in which the channel is formed. The transistor 100 is a surrounding gate transistor (SGT). The transistor 100 is also a so-called vertical transistor.

The transistor 100 includes a first electrode 12, a second electrode 14, an oxide semiconductor layer 16, a gate electrode 18, a gate insulating layer 20, a first insulating layer 24, and a second insulating layer 26. The oxide semiconductor layer 16 includes a high resistance region 16a, a low resistance region 16b, and a channel formation region 16c.

The high resistance region 16a is an example of the first region. The low resistance region 16b is an example of the second region. The channel formation region 16c is an example of the third region.

The first electrode 12 functions as a source electrode or a drain electrode of the transistor 100.

The first electrode 12 is a conductor. The first electrode 12 includes, for example, an oxide conductor or a metal. The first electrode 12 is, for example, an oxide conductor containing indium (In), tin (Sn), and oxygen (O). The first electrode 12 is, for example, indium tin oxide. The first electrode 12 is, for example, a metal such as tungsten (W), molybdenum (Mo), copper (Cu), aluminum (Al), titanium (Ti), or tantalum (Ta).

The first electrode 12 may comprise, for example, a stacked structure of a plurality of conductors.

The second electrode 14 functions as a source electrode or a drain electrode of the transistor 100. A direction from the first electrode 12 toward the second electrode 14 is the first direction.

The second electrode 14 is a conductor. The second electrode 14 includes, for example, an oxide conductor or a metal. The second electrode 14 is, for example, an oxide conductor containing indium (In), tin (Sn), and oxygen (O). The second electrode 14 is, for example, indium tin oxide. The second electrode 14 is, for example, a metal such as tungsten (W), molybdenum (Mo), copper (Cu), aluminum (Al), titanium (Ti), or tantalum (Ta).

The second electrode 14 may comprise, for example, a stacked structure of a plurality of conductors.

The first electrode 12 and the second electrode 14 are formed of, for example, the same material. Each of the first electrode 12 and the second electrode 14 can be, for example, an oxide conductor containing indium (In), tin (Sn), and oxygen (O). The first electrode 12 and the second electrode 14 are, for example, both indium tin oxide.

The oxide semiconductor layer 16 is provided between the first electrode 12 and the second electrode 14. The oxide semiconductor layer 16 is in contact with the first electrode 12. The oxide semiconductor layer 16 is also in contact with the second electrode 14.

A length of the oxide semiconductor layer 16 in the first direction is, for example, 80 nm to 200 nm. A width of the oxide semiconductor layer 16 in the second direction is, for example, 20 nm to 100.

The oxide semiconductor layer 16 comprises an oxide semiconductor material. The oxide semiconductor layer 16 is, for example, amorphous.

The oxide semiconductor layer 16 comprises, for example, at least one element selected from a group including indium (In), gallium (Ga), silicon (Si), aluminum (Al), and tin (Sn), zinc (Zn), and oxygen (O). The oxide semiconductor layer 16 comprises, for example, indium (In), gallium (Ga), and zinc (Zn). The oxide semiconductor layer 16 comprises, for example, indium (In), aluminum (Al), and zinc (Zn).

In an example, the oxide semiconductor layer 16 contains at least one element selected from a group including titanium (Ti), zinc (Zn), and tungsten (W). The oxide semiconductor layer 16 is, for example, titanium oxide, zinc oxide, or tungsten oxide.

The oxide semiconductor layer 16 has, for example, a chemical composition different from a chemical composition of the first electrode 12 and a chemical composition of the second electrode 14.

The oxide semiconductor layer 16 includes the high resistance region 16a, the low resistance region 16b, and the channel formation region 16c.

The high resistance region 16a is provided on a first electrode 12 side of the oxide semiconductor layer 16. The high resistance region 16a is in contact with the first electrode 12.

The high resistance region 16a functions as a source region or a drain region of the transistor 100. The high resistance region 16a includes, for example, oxygen vacancies. The oxygen vacancies in the high resistance region 16a function as donors. The high resistance region 16a has a first resistivity.

The high resistance region 16a has a first length (L1 in FIG. 1) in the first direction. The first length L1 is a distance from the first electrode 12 to the channel formation region 16c in the first direction.

The low resistance region 16b is provided between the high resistance region 16a and the second electrode 14. The low resistance region 16b is provided on a second electrode 14 side of the oxide semiconductor layer 16. The low resistance region 16b is in contact with the second electrode 14.

The low resistance region 16b functions as a source region or a drain region of the transistor 100. The low resistance region 16b includes, for example, oxygen vacancies. The oxygen vacancies in the low resistance region 16b function as donors. An oxygen vacancy concentration in the low resistance region 16b is, for example, higher than an oxygen vacancy concentration in the high resistance region 16a.

The low resistance region 16b has a second resistivity. The second resistivity is lower than the first resistivity. In other words, the first resistivity is higher than the second resistivity. In other words, a resistivity of the high resistance region 16a is higher than a resistivity of the low resistance region 16b. The first resistivity is, for example, 1.1 times to 5 times the second resistivity.

The first resistivity of the high resistance region 16a is represented by, for example, a resistivity in the vicinity of a midpoint (MP1 in FIG. 1) of a line segment connecting, along the first direction, the first electrode 12 and an extension line in the second direction of an end portion of the gate electrode 18 on the first electrode 12 side, in the oxide semiconductor layer 16. The second resistivity of the low resistance region 16b is represented by, for example, a resistivity in the vicinity of a midpoint (MP2 in FIG. 1) of a line segment connecting, in the first direction, the second electrode 14 and an extension line in the second direction of an end portion of the gate electrode 18 on the second electrode 14 side, in the oxide semiconductor layer 16.

The low resistance region 16b has a second length (L2 in FIG. 1) in the first direction. The second length L2 is a distance from the second electrode 14 to the channel formation region 16c in the first direction.

The second length L2 is longer than the first length L1. In other words, the first length L1 is shorter than the second length L2. The second length L2 is, for example, 1.1 times 5 times the first length L1.

The channel formation region 16c is provided between the high resistance region 16a and the low resistance region 16b. A channel serving as a current path when the transistor 100 is turned on is formed in the channel formation region 16c.

The channel formation region 16c has a third resistivity. The third resistivity is higher than the first resistivity and the second resistivity. In other words, the resistivity of the channel formation region 16c is higher than the resistivities of the high resistance region 16a and the low resistance region 16b. In other words, the resistivities of the high resistance region 16a and the low resistance region 16b are lower than the resistivity of the channel formation region 16c.

For example, an oxygen vacancy concentration of the channel formation region 16c is lower than the oxygen vacancy concentrations of the high resistance region 16a and the low resistance region 16b. In other words, the oxygen vacancy concentrations of the high resistance region 16a and the low resistance region 16b are higher than the oxygen vacancy concentration of the channel formation region 16c.

The gate electrode 18 faces the oxide semiconductor layer 16. As shown in FIG. 2, the gate electrode 18 surrounds the oxide semiconductor layer 16. The gate electrode 18 is provided around the oxide semiconductor layer 16. In particular, the gate electrode 18 surrounds the channel formation region 16c.

The gate electrode 18 is, for example, a metal, a metal compound, or a semiconductor. The gate electrode 18 contains, for example, tungsten (W).

A length of the gate electrode 18 in the first direction is, for example, 20 nm to 100 nm.

For example, a length (Lch in FIG. 1) of the channel formation region 16c facing the gate electrode 18 in the first direction is referred to as the channel length of the transistor 100.

A first distance (d1 in FIG. 1) between the first electrode 12 and the gate electrode 18 in the first direction is shorter than a second distance (d2 in FIG. 1) between the gate electrode 18 and the second electrode 14 in the first direction. In other words, the second distance d2 between the gate electrode 18 and the second electrode 14 in the first direction is longer than the first distance d1 between the first electrode 12 and the gate electrode 18 in the first direction.

The first distance d1 is a distance, in the first direction, from the first electrode 12 to the end portion of the gate electrode 18 on the first electrode 12 side. The second distance d2 is a distance, in the first direction, from the second electrode 14 to the end portion of the gate electrode 18 on the second electrode 14 side.

The second distance d2 is, for example, 1.1 times to 5 times the first distance d1.

The gate insulating layer 20 is provided between the gate electrode 18 and the oxide semiconductor layer 16. The gate insulating layer 20 is provided between the gate electrode 18 and the channel formation region 16c. The gate insulating layer 20 surrounds the oxide semiconductor layer 16.

The gate insulating layer 20 is in contact with the oxide semiconductor layer 16. The gate insulating layer 20 is in contact with the channel formation region 16c.

The gate insulating layer 20 is, for example, an oxide or an oxynitride. The gate insulating layer 20 is, for example, silicon oxide or aluminum oxide. A thickness of the gate insulating layer 20 is, for example, 2 nm to 10 nm.

The first insulating layer 24 is provided between the first electrode 12 and the gate electrode 18. The first insulating layer 24 surrounds the oxide semiconductor layer 16. The first insulating layer 24 surrounds the gate insulating layer 20. The gate insulating layer 20 is provided between the first insulating layer 24 and the oxide semiconductor layer 16.

The first insulating layer 24 is, for example, an oxide, a nitride, or an oxynitride. The first insulating layer 24 contains, for example, silicon oxide, silicon nitride, or silicon oxynitride. The first insulating layer 24 comprises, for example, a silicon oxide layer, a silicon nitride layer, or a silicon oxynitride layer. The first insulating layer 24 is, for example, a silicon oxide layer, a silicon nitride layer, or a silicon oxynitride layer.

The second insulating layer 26 is provided between the gate electrode 18 and the second electrode 14. The second insulating layer 26 surrounds the oxide semiconductor layer 16. The second insulating layer 26 surrounds the gate insulating layer 20. The gate insulating layer 20 is provided between the second insulating layer 26 and the oxide semiconductor layer 16.

The second insulating layer 26 is, for example, an oxide, a nitride, or an oxynitride. The second insulating layer 26 contains, for example, silicon oxide, silicon nitride, or silicon oxynitride. The second insulating layer 26 comprises, for example, a silicon oxide layer, a silicon nitride layer, or a silicon oxynitride layer. The second insulating layer 26 is, for example, a silicon oxide layer, a silicon nitride layer, or a silicon oxynitride layer.

Next, operations and effects of the semiconductor device according to the first embodiment will be described.

Figure 3:
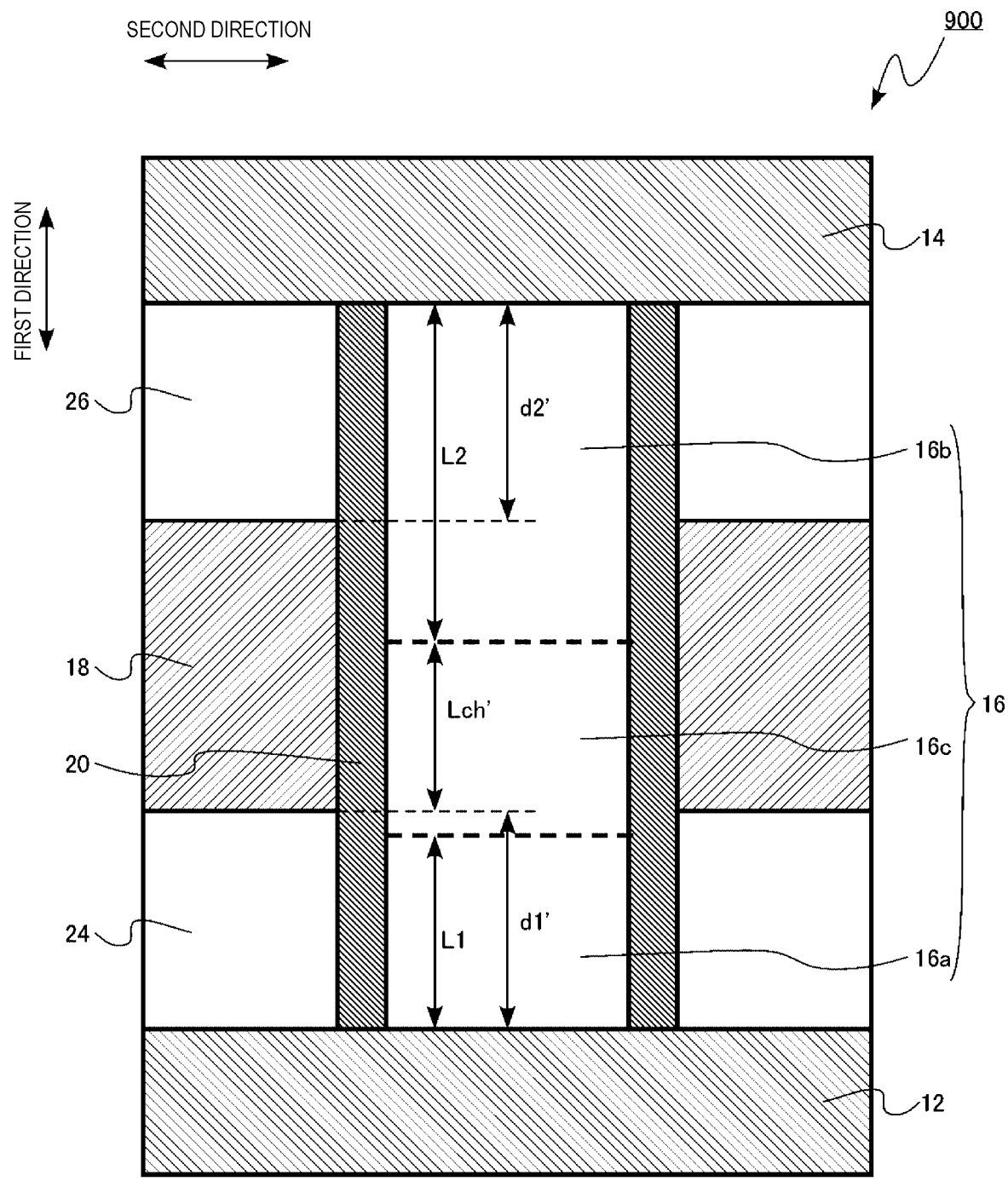
FIG. 3 is a schematic cross-sectional view of a semiconductor device according to a comparative example.

FIG. 3 is a schematic cross-sectional view of a semiconductor device according to a comparative example. FIG. 3 is a diagram corresponding in general to FIG. 1 of the first embodiment.

The semiconductor device according to the comparative example is a MOSFET 900 (transistor). The MOSFET 900 according to the comparative example is different from the transistor 100 according to the first embodiment in that a distance (d1' in FIG. 3) between the first electrode 12 and the gate electrode 18 in the first direction is equal to a distance (d2' in FIG. 3) between the gate electrode 18 and the second electrode 14 in the first direction.

Resistivities of the high resistance region 16a and the low resistance region 16b are lower than a resistivity of the channel formation region 16c. The reason is that, for example, oxygen vacancy concentrations of the high resistance region 16a and the low resistance region 16b are higher than an oxygen vacancy concentration of the channel formation region 16c.

For example, in a process of manufacturing the MOSFET 900, oxygen in the oxide semiconductor layer 16 diffuses toward the first electrode 12 side and desorbs. Accordingly, oxygen vacancies are formed, and the high resistance region 16a having a higher oxygen vacancy concentration than that of the channel formation region 16c is formed.

In addition, in the process of manufacturing the MOSFET 900, oxygen in the oxide semiconductor layer 16 diffuses toward the second electrode 14 side and desorbs. Accordingly, oxygen vacancies are formed, and the low resistance region 16b having a higher oxygen vacancy concentration than that of the channel formation region 16c is formed.

For example, when an amount of oxygen desorbed from the oxide semiconductor layer 16 on the first electrode 12 side is relatively smaller than that on the second electrode 14 side, the high resistance region 16a having a lower oxygen vacancy concentration than that of the low resistance region 16b is formed on the first electrode 12 side of the oxide semiconductor layer 16.

In the comparative example, the resistivity of the high resistance region 16a can be higher than the resistivity of the low resistance region 16b. In addition, since diffusion and desorption of oxygen do not progress as much in the high resistance region 16a as compared with the low resistance region 16b, the first length L1 of the high resistance region 16a is somewhat shorter than the second length L2 of the low resistance region 16b.

In the MOSFET 900, a length (Lch' in FIG. 3) of the channel formation region 16c facing the gate electrode 18 in the first direction is a channel length of the MOSFET 900. For example, when a length of the low resistance region 16b facing the gate electrode 18 in the first direction is increased, the channel length Lch' of the MOSFET 900 is shortened. Therefore, a problem occurs that a threshold voltage of the transistor 900 decreases due to a short channel effect.

In addition, when the high resistance region 16a and the gate electrode 18 are separated from each other in the first direction, there is no portion of the high resistance region 16a facing the gate electrode 18, and source and drain regions of the MOSFET 900 are offset with respect to the channel. If the source and drain regions of the transistor 900 are offset with respect to the channel, a problem occurs that an on-current of the MOSFET 900 decreases.

In the transistor 100 according to the first embodiment, the first distance (d1 in FIG. 1) between the first electrode 12 and the gate electrode 18 in the first direction is shorter than the second distance (d2 in FIG. 1) between the gate electrode 18 and the second electrode 14 in the first direction.

Therefore, for example, the length of the low resistance region 16b facing the gate electrode 18 in the first direction is shorter than that in the MOSFET 900 according to the comparative example. Therefore, the channel length Lch of the transistor 100 is increased, and a decrease in the threshold voltage due to the short channel effect is prevented.

In addition, the portion of high resistance region 16a facing the gate electrode 18 is present in the first embodiment. Therefore, the source and drain regions of the transistor 100 are not offset with respect to the channel. Therefore, a decrease in the on-current of the transistor 100 can be prevented.

As described above, according to the first embodiment, it is possible to implement a semiconductor device in which the decrease in the threshold voltage and the decrease in the on-current of the transistor are prevented, and excellent transistor characteristics are provided.

Second Embodiment

A semiconductor device according to a second embodiment is different from the semiconductor device according to the first embodiment in that the semiconductor device according to the second embodiment includes a substrate. Hereinafter, some description of the same contents as those of the first embodiment may be partially omitted.

Figure 4:
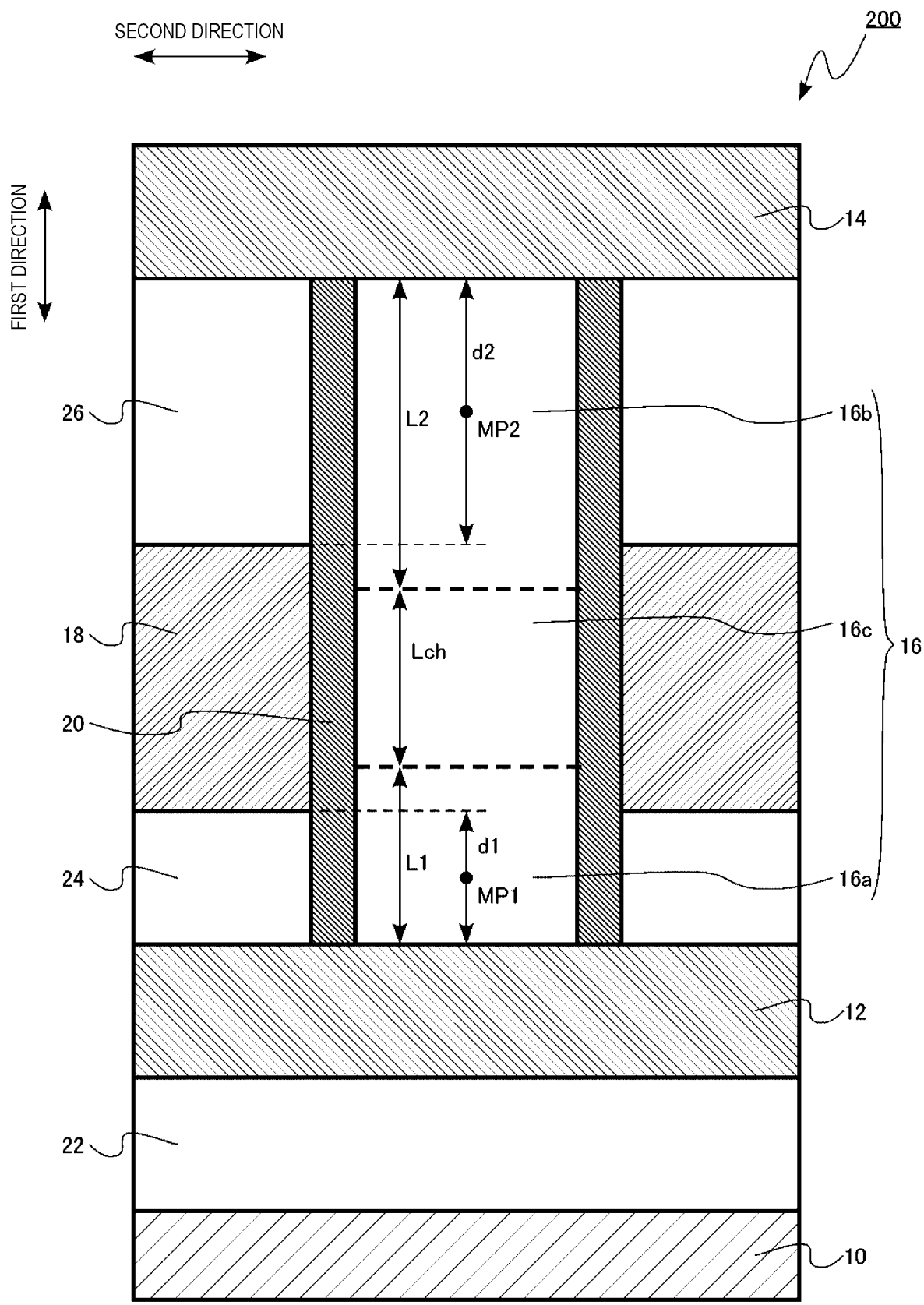
FIG. 4 is a schematic cross-sectional view of a semiconductor device according to a second embodiment.

FIG. 4 is a schematic cross-sectional view of the semiconductor device according to the second embodiment. The semiconductor device according to the second embodiment includes a transistor 200. FIG. 4 is a diagram corresponding in general to FIG. 1 of the first embodiment.

The transistor 200 includes the first electrode 12, the second electrode 14, the oxide semiconductor layer 16, the gate electrode 18, the gate insulating layer 20, the first insulating layer 24, and the second insulating layer 26. The oxide semiconductor layer 16 includes a high resistance region 16a, a low resistance region 16b, and a channel formation region 16c.

The high resistance region 16a is an example of the first region. The low resistance region 16b is an example of the second region. The channel formation region 16c is an example of the third region.

The transistor 200 is provided on a silicon substrate 10. The silicon substrate 10 is one example of a substrate.

The silicon substrate 10 is, for example, single crystal silicon. The substrate is not limited to a silicon substrate. The substrate adopted may be, for example, a semiconductor substrate other than a silicon substrate. The substrate may be, for example, an insulating substrate.

The first electrode 12 is provided on the silicon substrate 10. A substrate insulating layer 22 is provided between the silicon substrate 10 and the first electrode 12. The substrate insulating layer 22 comprises, for example, silicon oxide.

When the transistor 200 is manufactured, the first electrode 12, the oxide semiconductor layer 16, and the second electrode 14 are formed in this order on the silicon substrate 10.

As described above, according to the second embodiment, it is possible to implement a semiconductor device in which the decrease in the threshold voltage and the decrease in the on-current of the transistor are prevented, and excellent transistor characteristics are provided.

Third Embodiment

A semiconductor device according to a third embodiment is different from the semiconductor device according to the first embodiment in that the semiconductor device according to the third embodiment further includes an insulating layer between the first electrode and the gate electrode. This insulating layer includes a first layer and a second layer. The second layer has a higher dielectric constant than that of the first layer. This second layer can be provided between the first layer and the first electrode or between the first layer and the gate electrode. Hereinafter, some description of the same contents as those of the first embodiment may be partially omitted.

Figure 5:
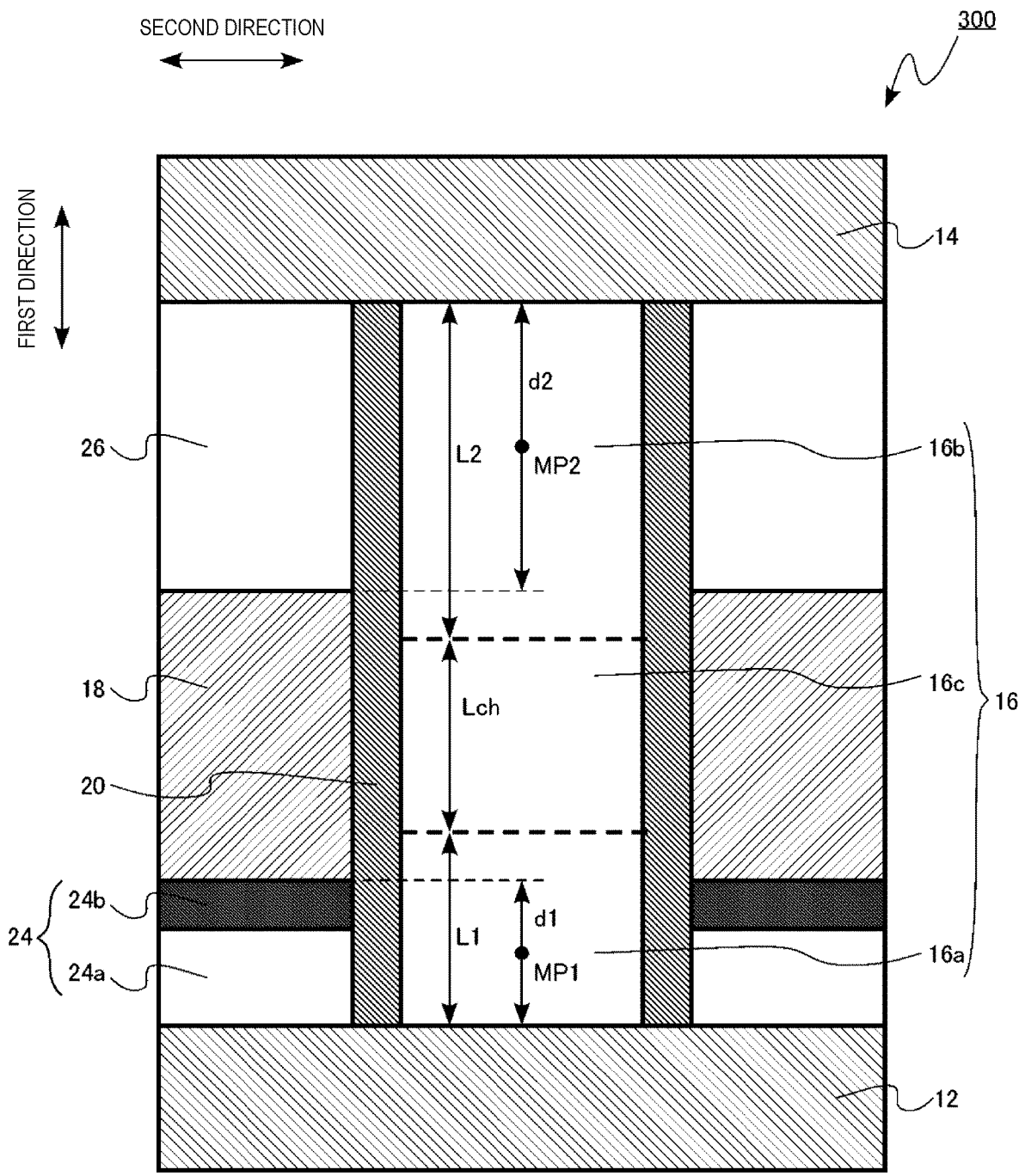
FIG. 5 is a schematic cross-sectional view of a semiconductor device according to a third embodiment.

FIG. 5 is a schematic cross-sectional view of the semiconductor device according to the third embodiment. The semiconductor device according to the third embodiment includes a transistor 300. FIG. 5 is a diagram corresponding in general to FIG. 1 of the first embodiment.

The transistor 300 includes the first electrode 12, the second electrode 14, the oxide semiconductor layer 16, the gate electrode 18, the gate insulating layer 20, the first insulating layer 24, and the second insulating layer 26. The oxide semiconductor layer 16 includes a high resistance region 16a, a low resistance region 16b, and a channel formation region 16c. The first insulating layer 24 includes a first layer 24a and a second layer 24b.

The high resistance region 16a is an example of the first region. The low resistance region 16b is an example of the second region. The channel formation region 16c is an example of the third region. The first insulating layer 24 is an example of the above-discussed insulating layer.

The second layer 24b is provided between the first layer 24a and the gate electrode 18.

The second layer 24b has a dielectric constant higher than that of the first layer 24a. The second layer 24b contains a second material having a dielectric constant higher than that of a first material contained in the first layer 24a.

The first material is, for example, silicon oxide. The second material is, for example, silicon nitride, silicon oxynitride, aluminum oxide, hafnium oxide, or zirconium oxide.

Since the first insulating layer 24 includes a first layer 24a and a second layer 24b having a dielectric constant higher than that of the first layer 24a, it is possible to prevent a leakage current between the first electrode 12 and the gate electrode 18. Therefore, for example, the first distance (d1 in FIG. 5) between the first electrode 12 and the gate electrode 18 in the first direction can be shortened more than in the transistor 100 according to the first embodiment.

Figure 6:
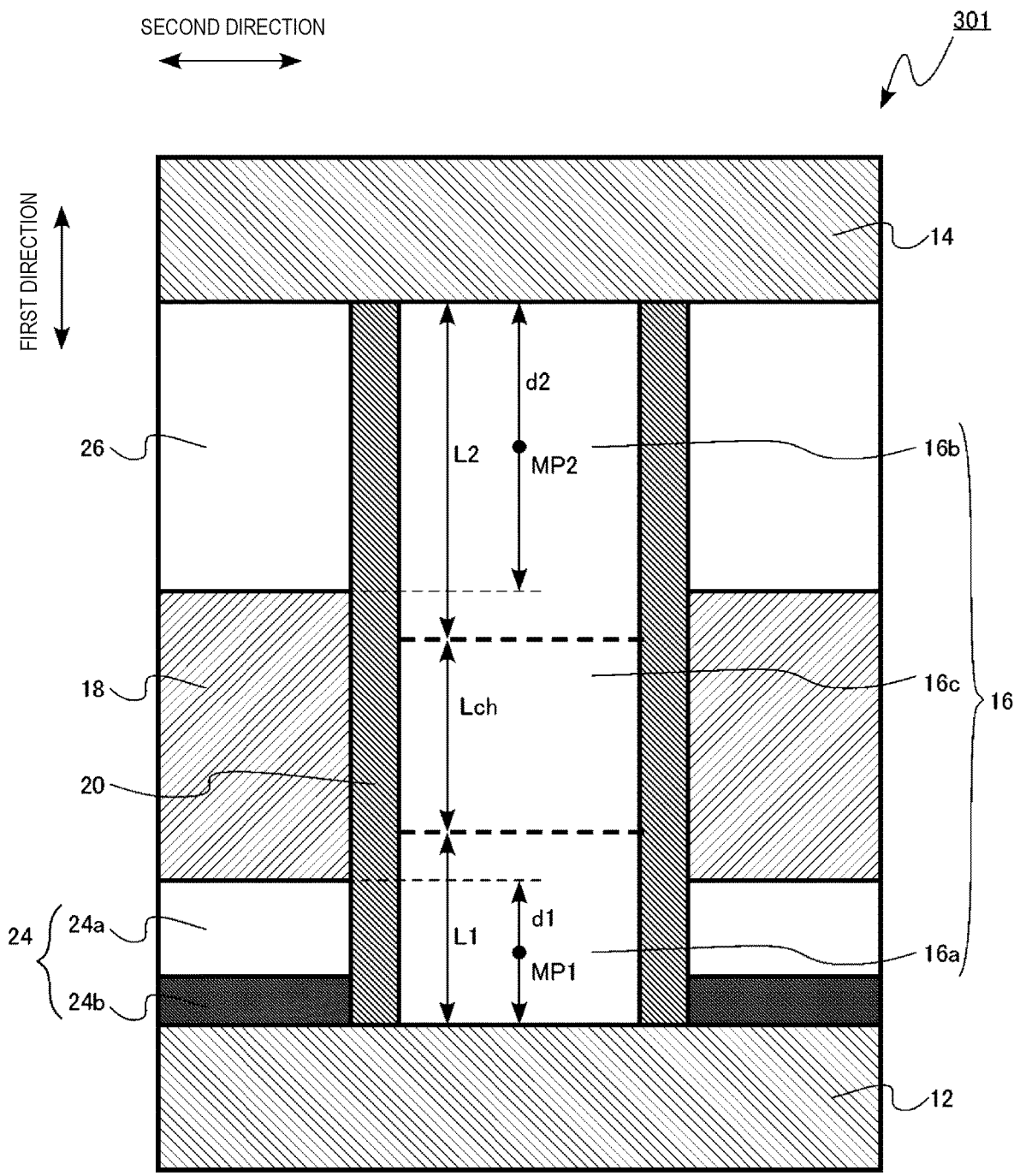
FIG. 6 is a schematic cross-sectional view of a semiconductor device according to a first modification of the third embodiment.

First Modification FIG. 6 is a schematic cross-sectional view of a semiconductor device according to a first modification of the third embodiment. The semiconductor device according to the first modification of the third embodiment includes a transistor 301.

The transistor 301 is different from the transistor 300 according to the third embodiment in that the second layer 24b is provided between the first electrode 12 and the first layer 24a. With transistor 301, it is possible to prevent (reduce) a leakage current between the first electrode 12 and the gate electrode 18.

Second Modification

Figure 7:
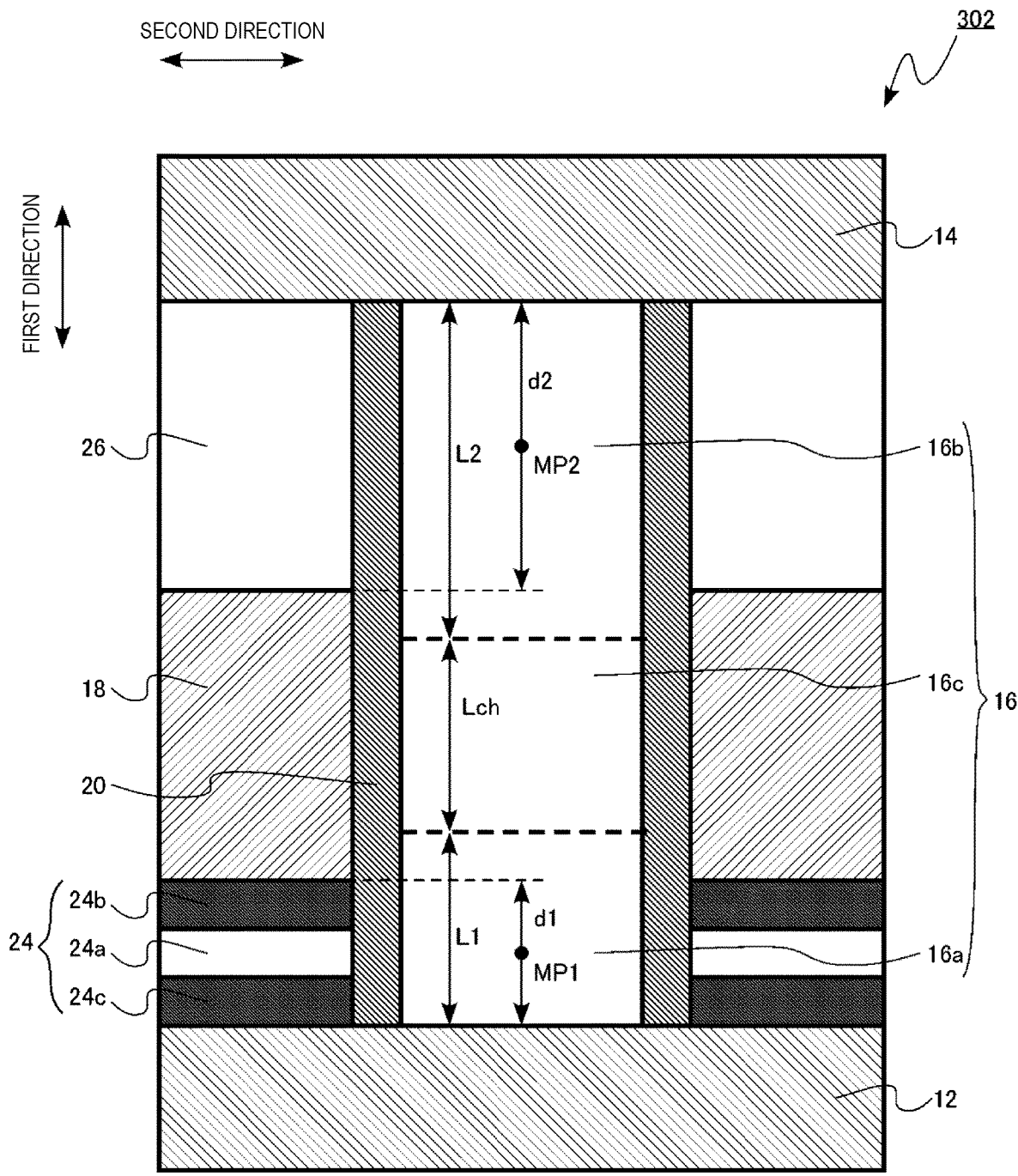
FIG. 7 is a schematic cross-sectional view of a semiconductor device according to a second modification of the third embodiment.

FIG. 7 is a schematic cross-sectional view of a semiconductor device according to a second modification of the third embodiment. The semiconductor device according to the second modification of the third embodiment includes a transistor 302.

The transistor 302 is different from the transistor 300 according to the third embodiment in that the first insulating layer 24 further includes a third layer 24c provided between the first electrode 12 and the first layer 24a.

The third layer 24c has a dielectric constant higher than that of the first layer 24a. The third layer 24c contains a third material having a dielectric constant higher than the first material contained in the first layer 24a. The first layer 24a is provided between the second layer 24b and the third layer 24c.

The first material is, for example, silicon oxide. The third material is, for example, silicon nitride, silicon oxynitride, aluminum oxide, hafnium oxide, or zirconium oxide.

With the transistor 303 according to the second modification, it is possible to further prevent (reduce) a leakage current between the first electrode 12 and the gate electrode 18.

As described above, according to the third embodiment and the modifications, it is possible to implement a semiconductor device in which the decrease in the threshold voltage and the decrease in the on-current of the transistor are prevented, and excellent transistor characteristics are provided.

Fourth Embodiment

A semiconductor device according to a fourth embodiment is different from the semiconductor device according to the first embodiment in that, in a cross section parallel to the first direction, a length of an interface between the first electrode and the oxide semiconductor layer in the second direction orthogonal to the first direction is shorter than a length of an interface between the second electrode and the oxide semiconductor layer in the second direction. Hereinafter, some description of the same contents as those of the first embodiment may be partially omitted.

Figure 8:
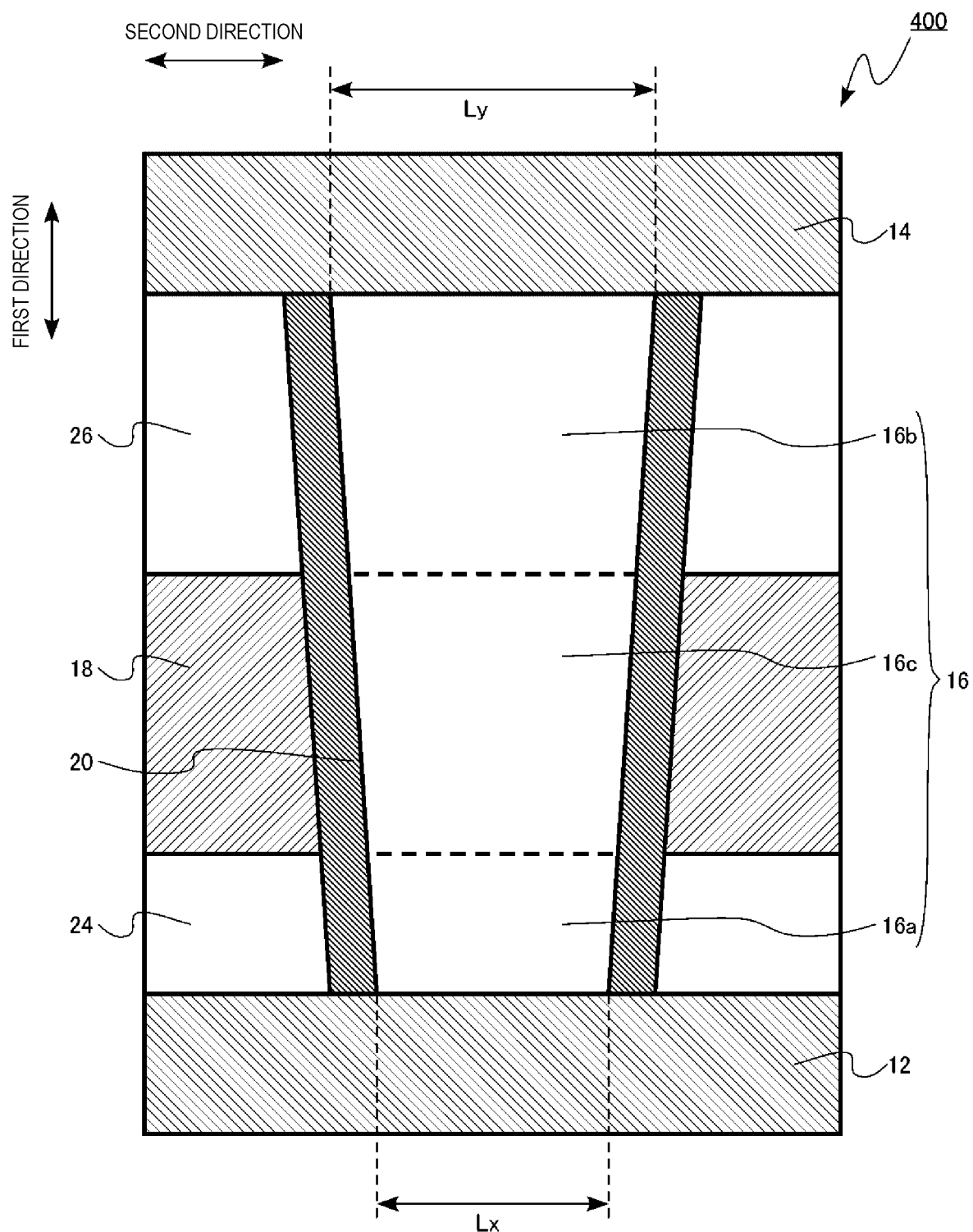
FIG. 8 is a schematic cross-sectional view of a semiconductor device according to a fourth embodiment.

FIG. 8 is a schematic cross-sectional view of the semiconductor device according to the fourth embodiment. The semiconductor device according to the fourth embodiment includes a transistor 400. FIG. 8 is a diagram corresponding in general to FIG. 1 of the first embodiment.

The transistor 400 includes the first electrode 12, the second electrode 14, the oxide semiconductor layer 16, the gate electrode 18, the gate insulating layer 20, the first insulating layer 24, and the second insulating layer 26. The oxide semiconductor layer 16 includes a high resistance region 16a, a low resistance region 16b, and a channel formation region 16c.

The high resistance region 16a is an example of the first region. The low resistance region 16b is an example of the second region. The channel formation region 16c is an example of the third region.

As shown in FIG. 8, in the cross section parallel to the first direction, a length (Lx in FIG. 8) of an interface between the first electrode 12 and the oxide semiconductor layer 16 in the second direction orthogonal to the first direction is shorter than a length (Ly in FIG. 8) of an interface between the second electrode 14 and the oxide semiconductor layer 16 in the second direction. In other words, the length Ly of the interface between the second electrode 14 and the oxide semiconductor layer 16 in the second direction is longer than the length Lx of the interface between the first electrode 12 and the oxide semiconductor layer 16 in the second direction. In the cross section parallel to the first direction, a side surface of the oxide semiconductor layer 16 has a forward tapered shape.

In a cross section perpendicular to the first direction, a width of the oxide semiconductor layer 16 in the second direction decreases, for example, from the second electrode 14 toward the first electrode 12.

By setting the length Ly of the interface between the second electrode 14 and the oxide semiconductor layer 16 in the second direction to be longer than the length Lx of the interface between the first electrode 12 and the oxide semiconductor layer 16 in the second direction, a contact area between the second electrode 14 and the oxide semiconductor layer 16 becomes larger than a contact area between the first electrode 12 and the oxide semiconductor layer 16. Therefore, a contact resistance between the second electrode 14 and the oxide semiconductor layer 16 can be reduced.

As described above, according to the fourth embodiment, it is possible to implement a semiconductor device in which the decrease in the threshold voltage and the decrease in the on-current of the transistor are prevented, and excellent transistor characteristics are provided.

Fifth Embodiment

A semiconductor device according to a fifth embodiment is different from the semiconductor device according to the first embodiment in that the semiconductor device according to the fifth embodiment includes a core insulating layer. Hereinafter, some description of the same contents as those of the first embodiment may be partially omitted.

Figure 9:
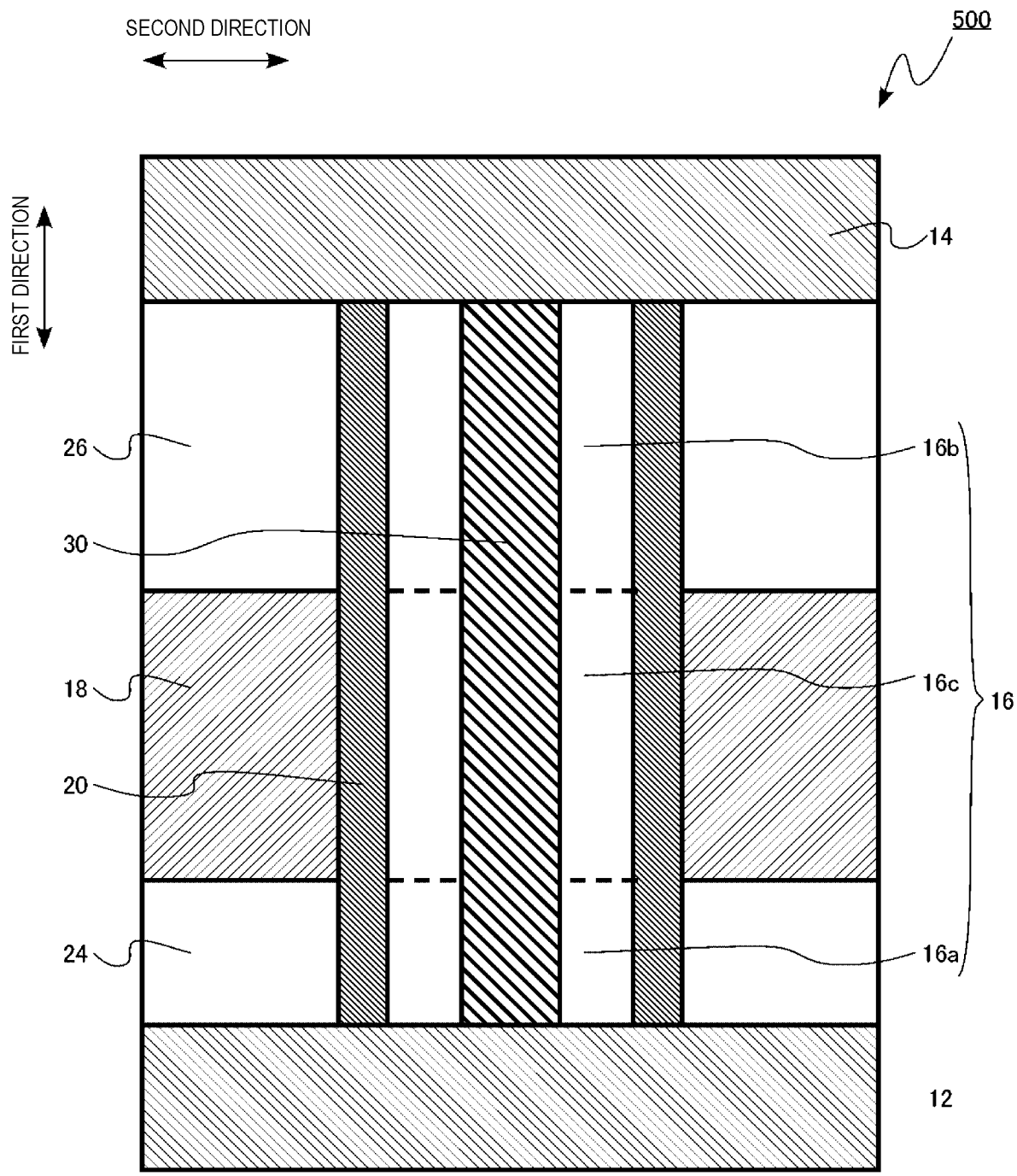
FIG. 9 is a schematic cross-sectional view of a semiconductor device according to a fifth embodiment.

FIG. 9 is a schematic cross-sectional view of the semiconductor device according to the fifth embodiment. The semiconductor device according to the fifth embodiment includes a transistor 500. FIG. 9 is a diagram corresponding in general to FIG. 1 of the first embodiment.

The transistor 500 includes the first electrode 12, the second electrode 14, the oxide semiconductor layer 16, the gate electrode 18, the gate insulating layer 20, the first insulating layer 24, the second insulating layer 26, and a core insulating layer 30. The oxide semiconductor layer 16 includes a high resistance region 16a, a low resistance region 16b, and a channel formation region 16c.

The high resistance region 16a is an example of the first region. The low resistance region 16b is an example of the second region. The channel formation region 16c is an example of the third region.

The core insulating layer 30 is surrounded by the oxide semiconductor layer 16 in a plane perpendicular to the first direction. The core insulating layer 30 is surrounded by the oxide semiconductor layer 16 in a cross section including the gate electrode 18 and perpendicular to the first direction, for example.

The core insulating layer 30 is, for example, an oxide, a nitride, or an oxynitride. The core insulating layer 30 contains, for example, silicon oxide, silicon nitride, or silicon oxynitride. The core insulating layer 30 includes, for example, a silicon oxide layer, a silicon nitride layer, or a silicon oxynitride layer. The core insulating layer 30 is, for example, a silicon oxide layer, a silicon nitride layer, or a silicon oxynitride layer.

Since the transistor 500 includes the core insulating layer 30, a volume occupied the channel formation region 16c decreases, and an off-leakage current of the transistor 500 decreases.

As described above, according to the fifth embodiment, it is possible to implement a semiconductor device in which the decrease in the threshold voltage and the decrease in the on-current of the transistor are prevented, and excellent transistor characteristics are provided.

Sixth Embodiment

A semiconductor memory device according to a sixth embodiment includes the semiconductor device according to the first embodiment and a capacitor electrically connected to the first electrode or the second electrode.

The semiconductor memory device according to the sixth embodiment is a semiconductor memory 600. The semiconductor memory device according to the sixth embodiment is a DRAM. The semiconductor memory 600 uses the transistor 100 according to the first embodiment as a switching transistor of a memory cell of the DRAM.

Hereinafter, some description of the same contents as those of the first embodiment may be partially omitted.

Figure 10:
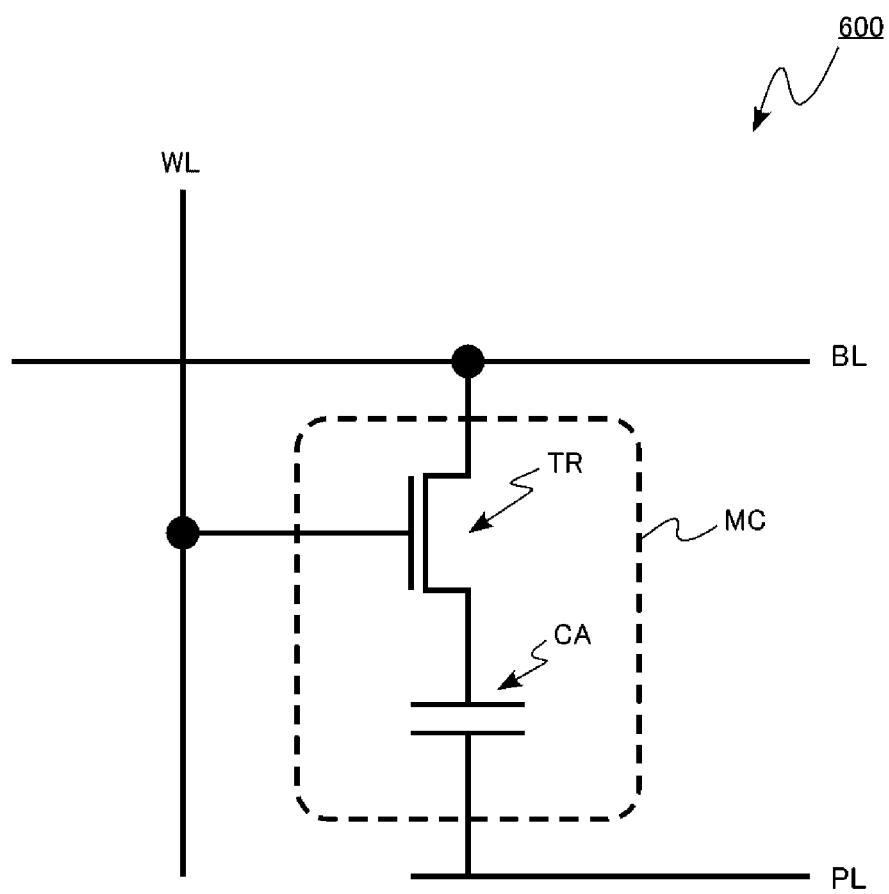
FIG. 10 is an equivalent circuit diagram of a semiconductor memory device according to a sixth embodiment.

FIG. 10 is an equivalent circuit diagram of the semiconductor memory device according to the sixth embodiment. FIG. 10 illustrates a case where one memory cell MC is provided, but a plurality of memory cells MC may be provided in an array, for example.

The semiconductor memory 600 includes the memory cell MC, a word line WL, a bit line BL, and a plate line PL. The memory cell MC includes a switching transistor TR and a capacitor CA. In FIG. 10, a region surrounded by a broken line is considered the memory cell MC.

The word line WL is electrically connected to a gate electrode of the switching transistor TR. The bit line BL is electrically connected to one of source and drain electrodes of the switching transistor TR. One electrode of the capacitor CA is electrically connected to the other electrode of the source and drain electrodes of the switching transistor TR. The other electrode of the capacitor CA is connected to the plate line PL.

The memory cell MC stores data by accumulating charges in the capacitor CA. Writing and reading of data are executed by turning on the switching transistor TR.

The switching transistor TR is turned on when a desired voltage is applied to the bit line BL, and data is written to the memory cell MC.

For example, the switching transistor TR is turned on, a voltage change of the bit line BL according to an amount of the charges accumulated in the capacitor is detected, and the data of the memory cell MC is read.

Figure 11:
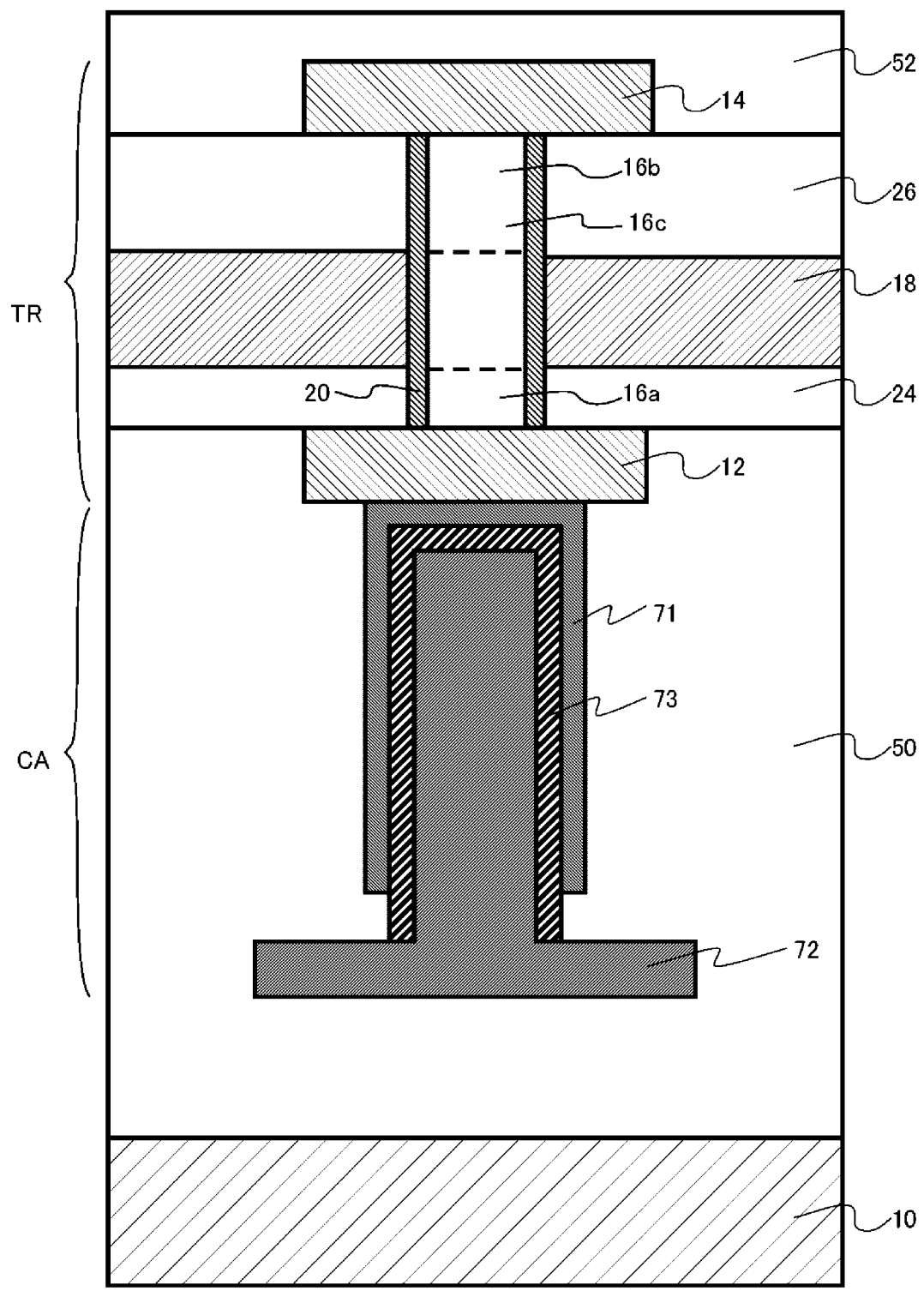
FIG. 11 is a schematic cross-sectional view of the semiconductor memory device according to a sixth embodiment.

FIG. 11 is a schematic cross-sectional view of the semiconductor memory device according to the sixth embodiment. FIG. 11 shows a cross section of the memory cell MC of the semiconductor memory 600.

The semiconductor memory 600 includes the silicon substrate 10, the switching transistor TR, the capacitor CA, a first interlayer insulating layer 50, and a second interlayer insulating layer 52.

The switching transistor TR includes the first electrode 12, the second electrode 14, the oxide semiconductor layer 16, the gate electrode 18, the gate insulating layer 20, the first insulating layer 24, and the second insulating layer 26.

The switching transistor TR has a structure similar to that of the transistor 100 according to the first embodiment.

The capacitor CA is provided between the silicon substrate 10 and the switching transistor TR. The capacitor CA is provided between the silicon substrate 10 and the first electrode 12. The capacitor CA is electrically connected to the first electrode 12.

The capacitor CA includes a cell electrode 71, a plate electrode 72, and a capacitor insulating film 73. The cell electrode 71 is electrically connected to the first electrode 12. For example, the cell electrode 71 is in contact with the first electrode 12.

The cell electrode 71 and the plate electrode 72 are, for example, titanium nitride. The capacitor insulating film 73 has, for example, a stacked structure of zirconium oxide, aluminum oxide, and zirconium oxide.

The gate electrode 18 is electrically connected to, for example, the word line WL (see FIG. 10). The second electrode 14 is electrically connected to, for example, the bit line BL (see FIG. 10). The plate electrode 72 is connected to, for example, the plate line PL (see FIG. 10).

In the semiconductor memory 600, an oxide semiconductor transistor having an extremely small channel leakage current during an OFF operation used in a switching transistor TR. Therefore, a DRAM having excellent charge retention characteristics can be implemented.

In the switching transistor TR of the semiconductor memory 600, the decrease in the threshold voltage and the decrease in the on-current of the transistor are prevented. Accordingly, operation characteristics of the semiconductor memory 600 are improved.

In the sixth embodiment, the semiconductor memory to which the transistor according to the first embodiment is applied is described as an example, but the semiconductor memory according to any of the other transistor embodiments (e.g., second to fifth embodiments) described may be incorporated in a semiconductor memory corresponding to the sixth embodiment.

In the sixth embodiment, the semiconductor memory in which the cell electrode is electrically connected to the first electrode 12 is described as an example, but the semiconductor memory may be a semiconductor memory in which a cell electrode is electrically connected to the second electrode 14.

The capacitor CA may be provided on the switching transistor TR. The switching transistor TR may be provided between the silicon substrate 10 and the capacitor CA.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. For example, the elements of one embodiment may be replaced or changed with the elements of another embodiment. The accompanying claims and their equivalents are intended to cover such forms or modifications as would fall within the scope and spirit of the disclosure.

What is claimed is:

1. A semiconductor device, comprising:
   a first electrode;
   a second electrode;
   an oxide semiconductor layer between the first electrode and the second electrode and including a first region, a second region between the first region and the second electrode, and a third region between the first region and the second region, a first material resistivity of the first region being higher than a second material resistivity of the second region;
   a gate electrode surrounding the third region; and
   a gate insulating layer between the gate electrode and the third region, wherein
   a first distance from the first electrode to the gate electrode along a first direction from the first electrode toward the second electrode is shorter than a second distance from the gate electrode to the second electrode along the first direction, and
   the oxide semiconductor layer directly contacts the first electrode and the second electrode.

2. The semiconductor device according to claim 1, further comprising:
   an insulating layer between the first electrode and the gate electrode and including a first layer and a second layer having a dielectric constant higher than that of the first layer, wherein
   the second layer is between the first layer and the first electrode or between the first layer and the gate electrode.

3. The semiconductor device according to claim 2, wherein
   the insulating layer further includes a third layer having a dielectric constant higher than that of the first layer, and
   the first layer is provided between the second layer and the third layer.

4. The semiconductor device according to claim 1, wherein, in a cross section parallel to the first direction, a length of an interface between the first electrode and the oxide semiconductor layer along a second direction orthogonal to the first direction is shorter than a length of an interface between the second electrode and the oxide semiconductor layer along the second direction.

5. A semiconductor memory device, comprising:
   a semiconductor device according to claim 1; and
   a capacitor electrically connected to the first electrode or the second electrode.

6. A semiconductor device, comprising:
   a first electrode;
   a second electrode;
   an oxide semiconductor column between the first electrode and the second electrode;
   a gate electrode surrounding the oxide semiconductor layer;
   a gate insulating layer between the gate electrode and the oxide semiconductor layer; and
   a substrate, the first electrode being between the substrate and the second electrode, wherein
   a first distance from the first electrode to the gate electrode along a first direction from the first electrode toward the second electrode is shorter than a second distance from the gate electrode to the second electrode along the first direction,
   the ends of the oxide semiconductor column directly contact the first electrode and the second electrode, and
   the oxide semiconductor column has regions of different material resistivity due to differences in oxygen vacancy concentration.

7. The semiconductor device according to claim 6, wherein the second distance is 1.1 times to 5 times the first distance.

8. The semiconductor device according to claim 1, further comprising:
   an insulating layer between the first electrode and the gate electrode and including a first layer and a second layer having a dielectric constant higher than that of the first layer, wherein
   the second layer is between the first layer and the first electrode or between the first layer and the gate electrode.

9. The semiconductor device according to claim 8, wherein
   the insulating layer further includes a third layer having a dielectric constant higher than that of the first layer, and
   the first layer is between the second layer and the third layer.

10. The semiconductor device according to claim 6, wherein, in a cross section parallel to the first direction, a length of an interface between the first electrode and the oxide semiconductor layer along a second direction orthogonal to the first direction is shorter than a length of an interface between the second electrode and the oxide semiconductor layer along the second direction.

11. The semiconductor device according to claim 6, wherein the substrate is a semiconductor substrate.

12. A semiconductor memory device, comprising:
    a semiconductor device according to claim 6; and
    a capacitor between the substrate and the first electrode and electrically connected to the first electrode.

13. A semiconductor device, comprising:
    a first electrode;
    a second electrode;
    an oxide semiconductor layer between the first electrode and the second electrode and including a first region, a second region between the first region and the second electrode, and a third region between the first region and the second region, a first material resistivity of the first region and a second material resistivity of the second region being lower than a third material resistivity of the third region, and a first length of the first region along a first direction from the first electrode toward the second electrode being shorter than a second length of the second region along the first direction;
    a gate electrode surrounding the third region; and
    a gate insulating layer between the gate electrode and the third region, wherein
    a first distance from the first electrode to the gate electrode along the first direction is shorter than a second distance from the gate electrode to the second electrode along the first direction, and
    the oxide semiconductor layer directly contacts the first electrode and the second electrode.

14. The semiconductor device according to claim 13, wherein the second length is 1.1 times to 5 times the first length.

15. The semiconductor device according to claim 13, further comprising:

an insulating layer between the first electrode and the gate electrode and including a first layer and a second layer having a dielectric constant higher than that of the first layer, wherein the second layer is between the first layer and the first electrode or between the first layer and the gate electrode.

16. The semiconductor device according to claim 15, wherein the insulating layer further includes a third layer having a dielectric constant higher than that of the first layer, and the first layer is between the second layer and the third layer.

17. The semiconductor device according to claim 13, wherein, in a cross section parallel to the first direction, a length of an interface between the first electrode and the oxide semiconductor layer along a second direction orthogonal to the first direction is shorter than a length of an interface between the second electrode and the oxide semiconductor layer along the second direction.

18. A semiconductor memory device, comprising:

a semiconductor device according to claim 13; and a capacitor electrically connected to the first electrode or the second electrode.

19. The semiconductor device according to claim 1, wherein the gate insulating layer surrounds the first region and second region of the oxide semiconductor layer, and the gate insulating layer directly contacts a surface of the first electrode facing the second electrode and a surface of the second electrode facing the first electrode.

20. The semiconductor device according to claim 1, wherein the first material resistivity measured at a midpoint position in the first region between the gate electrode and the first electrode is 1.1 times to 5 times the second material resistivity measured at a midpoint position in the second region between the gate electrode and the second electrode.

* * * * *